United States Patent

Redeker et al.

[11] Patent Number: 5,454,903
[45] Date of Patent: Oct. 3, 1995

[54] PLASMA CLEANING OF A CVD OR ETCH REACTOR USING HELIUM FOR PLASMA STABILIZATION

[75] Inventors: Fred C. Redeker; Charles Dornfest, both of Fremont; John Y. Leong, Los Altos, all of Calif.

[73] Assignee: Applied Materials, Inc., Santa Clara, Calif.

[21] Appl. No.: 145,991

[22] Filed: Oct. 29, 1993

[51] Int. Cl.$^6$ ........................................................ H05H 1/00
[52] U.S. Cl. .................. 216/67; 156/646.1; 156/643.1; 134/1
[58] Field of Search ................... 156/643, 646; 134/1

[56] References Cited

U.S. PATENT DOCUMENTS

| | | | |
|---|---|---|---|
| 4,960,488 | 10/1990 | Law et al. | 156/643 |
| 5,000,113 | 3/1991 | Wang et al. | 118/725 X |
| 5,017,264 | 5/1991 | Yamazaki et al. | 156/643 |
| 5,043,299 | 8/1991 | Chang et al. | 156/646 X |
| 5,158,644 | 10/1992 | Cheung et al. | 156/643 |
| 5,207,836 | 5/1993 | Chang | 134/1 |

FOREIGN PATENT DOCUMENTS

| | | |
|---|---|---|
| 11674 | 1/1988 | Japan . |
| 50985 | 2/1990 | Japan . |

*Primary Examiner*—Thi Dang
*Attorney, Agent, or Firm*—Richard T. Lyon; Robert M. Wallace

[57] ABSTRACT

A method of cleaning the interior of a vacuum chamber of an RF plasma reactor having RF plasma excitation apparatus and gas injection ports includes introducing etchant gases of the type tending to destabilize a plasma, such as $NF_3$ for example, into the vacuum chamber, applying RF power to the RF plasma excitation apparatus so as to ignite a plasma in the chamber and introducing an electron-donor gas into the chamber.

21 Claims, 1 Drawing Sheet

PLASMA CLEANING OF A CVD OR ETCH REACTOR USING HELIUM FOR PLASMA STABILIZATION

BACKGROUND OF THE INVENTION

1. Technical Field

The invention relates to a method of cleaning the interior surfaces of either a chemical vapor deposition (CVD) reactor or etch reactor using a plasma etch process to remove unwanted depositions such as silicon dioxide, and in particular to a cleaning method using an etch species such as $NF_3$.

2. Background Art

Reactors can perform various semiconductor processes on semiconductor substrates or wafers, including dielectric etching and chemical vapor deposition (CVD). A reactor can employ purely chemical processes to perform CVD or etching or else (depending upon the type of reactor) can perform RF plasma CVD or RF plasma etching. The present description does not concern the process employed to carry out etching or CVD on a wafer but rather concerns a process for cleaning the interior surfaces of the reactor. Typically, during processing unwanted depositions form on the interior surfaces of the reactor's vacuum chamber. For example, in a reactor used to perform chemical vapor deposition (CVD) of silicon dioxide films, silicon dioxide residue forms over the interior surfaces of the chamber. (In RF plasma CVD reactors having RF electrodes inside the chamber, the electrodes themselves can become contaminated with silicon dioxide.) Other materials can contaminate the chamber interior surfaces, depending upon the type of process performed by the reactor.

Such unwanted depositions, if allowed to build up on the interior surfaces of the reactor chamber, inhibit the performance of the reactor. Specifically, for example, in a CVD reactor, such unwanted depositions change the deposition rate from one wafer to the next, reduce the deposition uniformity across the surface of a given substrate and change the layer stress level so that the stress level cannot be maintained over deposition of successive thin film layers.

Preferably, the foregoing difficulties are generally avoided by cleaning the reactor chamber interior shortly before inserting a wafer to be processed into the chamber. If the reactor is equipped with RF plasma excitation electrodes and/or an RF plasma excitation antenna, then the reactor (which may perform a purely chemical etch or CVD process on a wafer) preferably operates during the cleaning process as an RF plasma etch reactor, with precursor etchant species such as $C_2F_6$ being introduced into the chamber and ignited into a plasma by the RF excitation apparatus of the reactor. For high-rate CVD RF plasma reactors, an RF excitation field of 13.56 MHz is employed to ignite the plasma and is used during both wafer processing and chamber clean operations. In fact, the combination of a 13.56 MHz RF field with $C_2F_6$ gas is generally what is employed in performing RF plasma etch of a silicon dioxide film on a semiconductor wafer or substrate. The etchant precursor species $C_2F_6$ gas, when ignited as a plasma, produces a radical $CF_3$ in the following reaction:

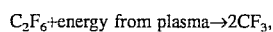

the $CF_3$ providing the fluorine etch species for etching of silicon dioxide.

The etch reaction with silicon dioxide is enhanced with the addition of oxygen gas to pyrolitically eliminate carbon, and may be approximated as follows:

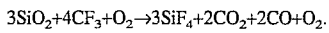

The problem with such a process is that unwanted depositions over various interior chamber surfaces typically have significantly varying thicknesses. Therefore, it is difficult for the foregoing reaction to uniformly remove unwanted depositions, some interior chamber surfaces remaining unclean after the other interior surfaces have been thoroughly cleaned. One solution to this problem might seem to be to simply perform the cleaning process for a longer time. However, this would further reduce the productive cycle of the reactor, forcing it to spend more time in the unproductive cleaning process rather than processing wafers.

The better solution is to supplement the gas in the reactor chamber with a more aggressive etchant species, such as $NF_3$ (for example) or another suitable nitrogen-fluorine compound, which is more aggressive in removing the unwanted depositions because it produces more fluorine in the plasma, as would be expected with other suitable nitrogen-fluorine compounds. Using this aggressive etch species, all of the interior surfaces of the reactor chamber are thoroughly cleaned in about the same time required to perform a CVD deposition step (e.g., about one minute). One characteristic property of $NF_3$ is that it is strongly electronegative (more so than $CF_4$ or $C_2F_6$) and therefore tends to reduce the population of free electrons in the plasma, due to its great affinity for electrons. The problem is that at RF excitation frequencies in the megaHertz range (such as, for example, 13.56 MHz), without a sufficient electron population there is not enough coupling between the RF signal and the plasma to sustain the plasma. This is because at such high frequencies, the electrons are the only charged particles in the plasma with sufficient charge-to-mass ratio to be able to follow the rapid megaHertz-frequency RF field oscillations. It is the electrons which kinetically couple the energy from the RF field to the ions and radicals in the plasma.

The result is that as $NF_3$ begins to reduce the electron population in the plasma, portions of the plasma become unstable, and flickering or collapsing of the plasma may be observed. This indicates that no plasma exists during brief periodic instances in various portions of the chamber in which insufficient electron population brings insufficient RF field coupling, temporarily reducing plasma density or quenching the plasma in those portions. Such plasma instability occurs at temperatures below 1000 degrees C. and at chamber pressures between 0.5 and 10 Torr and at RF excitation frequencies on the order of 13.56 MHz, which parameters are precisely in the regime of preferred CVD RF plasma reactors.

Such plasma instabilities make the cleaning process uncertain, since plasma flickering indicates that the plasma density is reduced or quenched in various regions for varying durations, making cleaning process control problematic. As a result, the chamber may not be entirely cleaned at the conclusion of a given chamber clean process performed for a specified period of time. With such instabilities, the effective plasma "on" time throughout the chamber is uncertain and so it is not possible to predict the required clean time with reasonable accuracy for consistent repetitive chamber clean operations. As a result, the specified chamber clean time with $NF_3$ for reliable chamber cleaning is increased.

In addition, as plasma density is reduced or quenched, arcing occurs in the plasma dark space near the electrodes, damaging them and causing significant impedance changes which bring about premature wear of the RF electrodes and RF generator.

One way around this problem might be to decrease the frequency of the RF excitation field to the point that electrons are not the only plasma particles able to follow the RF excitation. However, such an approach is not feasible because it would either increase the tendency for sputtering and require a separate RF excitation source.

Another way around this problem might be to lower the chamber pressure, but this approach risks more arcing and may tend to slow down the etching process, and therefore is not really a solution.

Accordingly, there has seemed to be no practical way around the problem of plasma instability arising from the requirement for a powerful etch/cleaning species such as $NF_3$ during chamber cleaning operations, especially for chamber pressures greater than 3.0 Torr.

SUMMARY OF THE INVENTION

A method of cleaning the interior of a vacuum chamber of an RF plasma reactor having RF plasma excitation apparatus and gas inlet ports includes introducing etchant gases of the type tending to destabilize a plasma, such as an electronegative gas like $NF_3$ for example, into the vacuum chamber, applying RF power to the RF plasma excitation apparatus so as to ignite a plasma in the chamber and introducing an electron-donor gas into the chamber.

DETAILED DESCRIPTION OF THE PREFERRED EMBODIMENT

Figure 1:
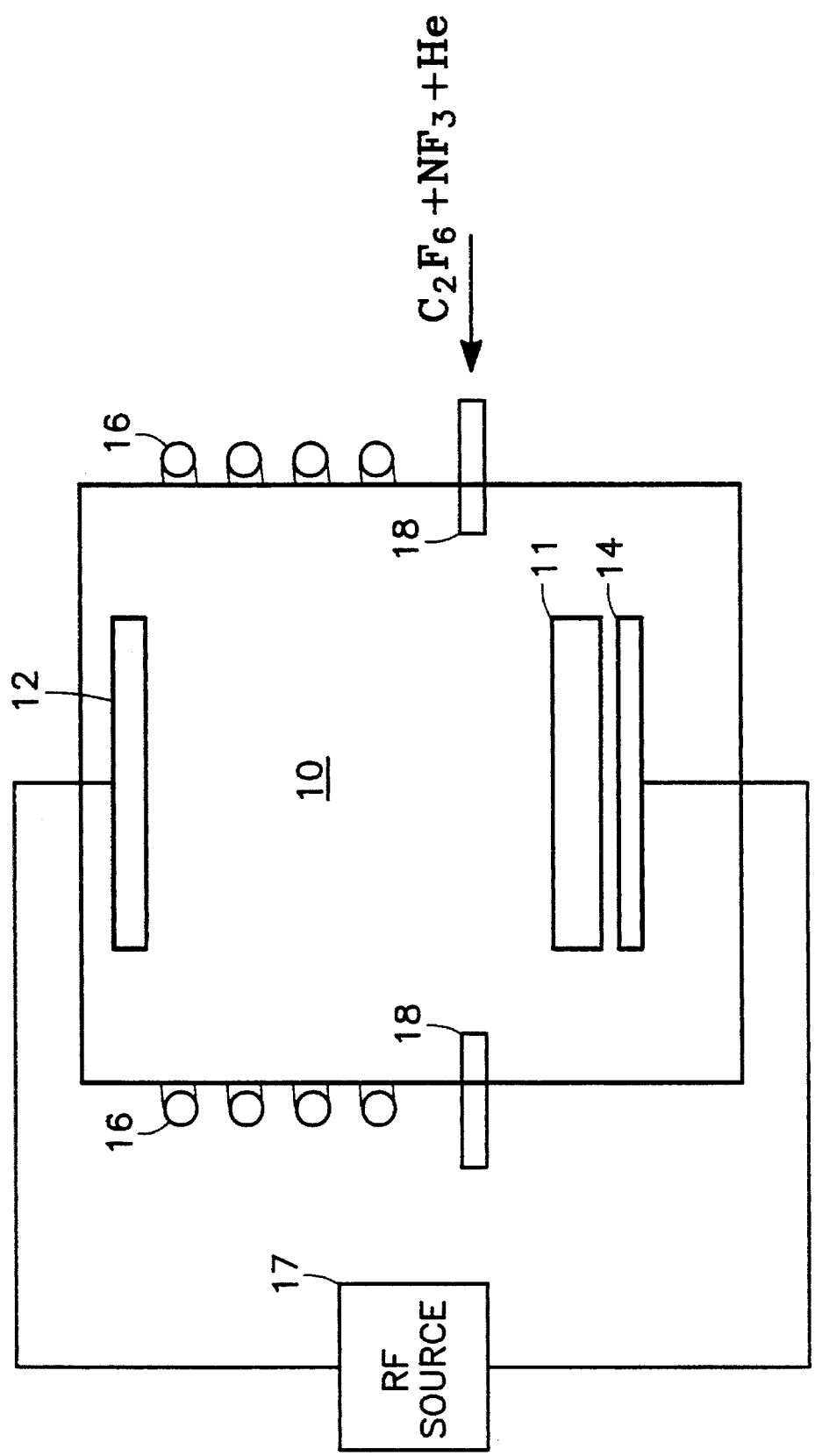
FIG. 1 is a diagram of one type of RF plasma reactor in which the invention is used.

The invention solves all of the foregoing problems by adding an electron-donor gas (i.e., a species having a low ionization energy) into the chamber during chamber clean operations which prevents plasma instabilities otherwise caused by the powerful but destabilizing $NF_3$ etching species. Preferably, the electron-donor gas has a sufficiently low atomic weight so that its presence does not introduce any appreciable sputtering effects beyond those already present in the chamber cleaning process described above. In the preferred embodiment, the electron-donor gas is Helium, which has the desired characteristic of contributing large quantities of electrons to the plasma (due to its low ionization energy), compensating for the population reduction thereof by the $NF_3$. Helium has the distinct advantage of being the second lowest-weight element in the periodic table, so as to introduce virtually no additional appreciable sputtering effects on the chamber surfaces.

Referring to FIG. 1, a reactor, which is normally used for either chemical etching or chemical CVD or plasma etching or plasma CVD, includes a vacuum chamber 10, a wafer susceptor 11 for holding a semiconductor substrate or wafer to be processed (but not during chamber clean operations), RF excitation apparatus such as electrodes 12, 14 and/or an RF antenna 16, an RF source 17 and gas inlet ports 18. In one embodiment, a chamber clean operation consists of driving the RF excitation electrodes 12, 14 with between 300 and 2000 watts of RF power at 13.56 MHz, holding the chamber 10 at a pressure of between 0.5 and 10 Torr, while introducing the following gases in the following amounts in standard cubic centimeters (SCCM) per minute through the gas injection ports 18:

TABLE I

| Gas | Gas Flow Rate (SCCM) |
| --- | --- |
| $C_2F_6$ | 600 |
| $O_2$ | 600 |
| $NF_3$ | 45 |
| He | 600 |

While other gases, such as Argon, having a tendency similar to Helium to donate electrons to the plasma, could be employed, the heavier atomic mass (of Argon for example) tends to increase unwanted sputtering effects, and therefore is not as preferred.

While the invention has been described in detail by specific reference to preferred embodiments, it is understood that variations and modifications thereof may be made without departing from the true spirit and scope of the invention.

What is claimed is:

1. A method of cleaning the interior of a vacuum chamber of either an etch reactor or a CVD reactor, said reactor having RF plasma excitation apparatus and gas inlet ports, comprising:

introducing an etchant gas through said inlet ports into said vacuum chamber;

applying RF power to said RF plasma excitation apparatus so as to ignite and maintain a plasma in said chamber; and introducing an electron-donor gas into said chamber while the plasma is being maintained within said chamber, said electron donor gas having a sufficiently low atomic mass to avoid introducing appreciable sputtering effects by said plasma, and wherein, said chamber is at a pressure in excess of 1.0 Torr.

2. The method of claim 1 wherein said etchant gas is of the type tending to destabilize a plasma.

3. The method of claim 2 wherein said etchant gas comprises a fluorine compound.

4. The method of claim 3 wherein said fluorine compound comprises a nitrogen-fluorine compounds.

5. The method of claim 4 wherein said nitrogen-fluorine compound comprises $NF_3$.

6. The method of claim 3 wherein said fluorine compound comprises a carbon-fluorine compound.

7. The method of claim 2 wherein said etchant gas comprises an electronegative gas.

8. The method of claim 7 wherein said electronegative gas comprises and nitrogen-fluorine compound.

9. The method of claim 9 wherein said nitrogen-fluorine compound comprises $NF_3$.

10. The method of claim 8 wherein said electronegative gas comprises a carbon-fluorine compound.

11. The method of claim 1 wherein said electron-donor gas comprises a Noble gas.

12. The method of claim 11 wherein said Noble gas comprises Helium.

13. In a RF plasma chamber apparatus for processing substrates, a method of cleaning the processing chamber, comprising the steps of:

introducing into a chamber environment a gas comprising fluorine;

operating the apparatus at a megaHertz RF frequency to establish and maintain a plasma within said chamber; and providing an electron-donor gas into said chamber while the plasma is being maintained within said chamber, said electron donor gas having a sufficiently low molecular weight to avoid introducing appreciable sputtering effects by said plasma, and wherein, said chamber is at a pressure in excess of 1.0 Torr.

14. The method of claim 13, in which said electron-donor gas is Helium.

15. The method of claim 13, in which said chamber environment is heated to substrate processing temperatures.

16. The method of claim 13, in which said chamber environment is maintained in an evacuated state comparable to that suitable for processing of substrates.

17. A method of cleaning the interior of a vacuum chamber for processing substrates, comprising:

in the absence of a substrate, establishing an evacuated environment within said chamber which includes a cleaning gas comprising fluorine and nitrogen;

establishing an RF plasma within said chamber to generate fluorine radicals for consuming unwanted depositions with said chamber; and stabilizing said plasma by introducing an electron donor gas into said environment, said electron donor gas having a sufficiently low molecular weight to avoid introducing appreciable sputtering effects by said plasma, and wherein, said chamber is at a pressure in excess of 1.0 Torr.

18. A method as in claim 17 wherein said cleaning gas comprises $NF_3$.

19. A method as in claim 17 wherein said electron-donor gas comprises Helium.

20. A method as in claim 17 in which said evacuated environment is heated to temperatures below about 1000 degrees C.

21. A method as in claim 17 in which said plasma is excited by an RF electric field in the megaHertz frequency range.

* * * * *